US011441960B2

(12) United States Patent
Ge et al.

(10) Patent No.: US 11,441,960 B2
(45) Date of Patent: Sep. 13, 2022

(54) MICROFLUIDIC PRESSURE SENSOR

(71) Applicant: Hewlett-Packard Development Company, L.P., Houston, TX (US)

(72) Inventors: Ning Ge, Palo Alto, CA (US); Alexander Govyadinov, Corvallis, OR (US); Anita Rogacs, San Diego, CA (US); Viktor Shkolnikov, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 962 days.

(21) Appl. No.: 16/074,349

(22) PCT Filed: Apr. 20, 2016

(86) PCT No.: PCT/US2016/028523
§ 371 (c)(1),
(2) Date: Jul. 31, 2018

(87) PCT Pub. No.: WO2017/184137
PCT Pub. Date: Oct. 26, 2017

(65) Prior Publication Data
US 2021/0190616 A1    Jun. 24, 2021

(51) Int. Cl.
*G01L 9/00* (2006.01)
*B81B 1/00* (2006.01)
(Continued)

(52) U.S. Cl.
CPC .............. *G01L 9/0095* (2013.01); *B81B 1/00* (2013.01); *B81B 7/02* (2013.01); *G01L 7/187* (2013.01);
(Continued)

(58) Field of Classification Search
CPC ................... G01L 9/0095; G01L 7/187; G01L 2019/0053; B81B 1/00; B81B 7/02; B81B 2201/0264
See application file for complete search history.

(56) References Cited

U.S. PATENT DOCUMENTS

| 3,731,679 A | * | 5/1973 | Wilhelmson | ........ A61M 5/1452 604/121 |
| 4,754,647 A | | 7/1988 | Clarke | |

(Continued)

FOREIGN PATENT DOCUMENTS

| KR | 20060019054 | 3/2006 |
| WO | WO-2005-103673 A1 | 11/2005 |

(Continued)

OTHER PUBLICATIONS

Yoon, J-Y. et al.;"Lab-on-a-Chip Pathogen Sensors for Food Safety"; Aug. 6, 2012; http://www.ncbi.nlm.nih.gov/pmc/articles/PMC3472853/.

*Primary Examiner* — Natalie Huls
*Assistant Examiner* — Cynthia L Davis
(74) *Attorney, Agent, or Firm* — Tong Rea Bentley & Kim LLC

(57) ABSTRACT

A microfluidic pressure sensor may include a reference chamber, a sensed volume, a microfluidic channel connecting an interior of the reference chamber to an interior of the sensed volume, a volume of liquid contained and movable within the microfluidic channel while occluding the microfluidic channel and a sensor to output signals indicating positioning of the volume of liquid along the microfluidic channel. Positioning of the volume of liquid along microfluidic channel indicates a pressure of the sensed volume.

14 Claims, 2 Drawing Sheets

(51) Int. Cl.
   *B81B 7/02*    (2006.01)
   *G01L 7/18*    (2006.01)
   *G01L 19/00*   (2006.01)

(52) U.S. Cl.
   CPC ............... *B81B 2201/0264* (2013.01); *G01L 2019/0053* (2013.01)

(56) References Cited

U.S. PATENT DOCUMENTS

| | | |
|---|---|---|
| 7,724,373 B2 | 5/2010 | Glazier et al. |
| 8,609,426 B2 | 12/2013 | Silver |
| 8,850,895 B2 | 10/2014 | Yan |
| 9,097,599 B2 * | 8/2015 | Phan ............... G01L 7/18 |
| 2005/0142567 A1 * | 6/2005 | Su ............... G01N 21/6458 |
| | | 435/6.11 |
| 2007/0125178 A1 * | 6/2007 | Rosenau ............... G01L 9/0095 |
| | | 73/724 |
| 2012/0061239 A1 * | 3/2012 | Elibol ............... B01L 3/502715 |
| | | 204/406 |
| 2012/0276549 A1 | 11/2012 | Cunningham et al. |
| 2013/0086988 A1 | 4/2013 | Evans et al. |
| 2013/0203157 A1 | 8/2013 | Cheung |
| 2015/0276406 A1 | 10/2015 | Rastegar et al. |
| 2016/0007851 A1 * | 1/2016 | Araci ............... A61B 8/0841 |
| | | 600/403 |
| 2016/0022447 A1 | 1/2016 | Kim et al. |

FOREIGN PATENT DOCUMENTS

| | | |
|---|---|---|
| WO | WO-2012-096480 A2 | 7/2012 |
| WO | WO-2014-096977 A2 | 6/2014 |

* cited by examiner

MICROFLUIDIC PRESSURE SENSOR

BACKGROUND

Microfluidics technology has found many applications in the biomedical field, cell biology, protein crystallization and other areas. The scale of microfluidics presents many design challenges.

DETAILED DESCRIPTION OF EXAMPLES

The present disclosure describes example microfluidic pressure sensors. The example microfluidic pressure sensors sense the positioning of a movable volume of liquid within a microfluidic channel to determine a pressure of a sensed volume. As a result, the example microfluidic pressure sensors are well-suited for use in microfluidic devices, micro electromechanical systems (MEMS) and nano electromechanical systems (NEMS).

Figure 1:
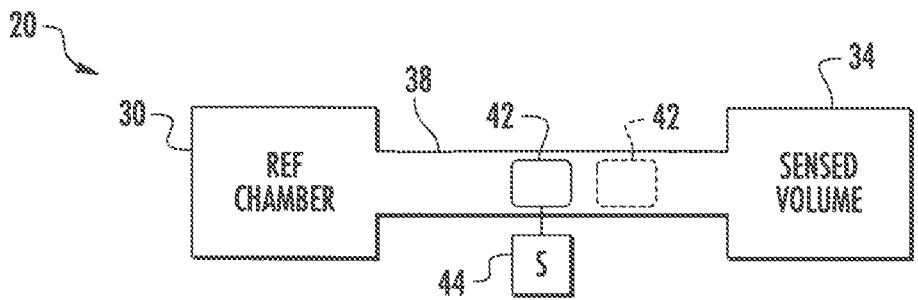
FIG. 1 is a schematic diagram of an example pressure sensor.

FIG. 1 schematically illustrates an example on-chip pressure sensor 20. Pressure sensor 20 has as a construction that facilitates its use in microfluidic devices. Pressure sensor 20 has an architecture that facilitates its use in micro-electromechanical systems as well as smaller systems such as nano electromechanical systems. Pressure sensor 20 may be integrated into and as part of microfluidic devices, such as microfluidic sensing chips, allowing pressure sensing to be more easily integrated into such devices.

Pressure sensor 20 comprises a microfluidic pressure sensor for sensing a pressure in a microfluidic volume or channel. For purposes of this disclosure, the term "microfluidic" refers to volumes containing fluids or through such fluid flow, wherein such volumes have at least one dimension in the range of a micrometer or tens of micrometers. For purposes of this disclosure, the term "microfluidic" also refers to such volumes have at least one dimension smaller than a micrometer.

Pressure sensor 20 comprises reference chamber 30, sensed chamber 34, microfluidic channel 36, liquid volume 42 and sensor 44. In one implementation, each of such components is formed as part of a microfluidic chip having microfluidic passages for guiding and directing fluid. In one implementation, reference chamber 30, sensed volume 34 and microfluidic channel 38 are each formed in one integral or unitary substrate body or wafer body. In other implementations, reference chamber 30, sensed volume 34 and microfluidic channel 38 may be formed in separate substrates or wafer structures, wherein the separate strictures are joined or coupled to one another. In one implementation, reference chamber 30, sensed volume 34 and microfluidic channel 38 are molded, cut or etched into a substrate or wafer structure, wherein sensor 44 is integrally formed as part of or into the same substrate or wafer structure. For example, rather than being a separate self-contained unit that is mounted to the substrate or wafer structure, sensor 44 is integrated into the materials of the substrate or wafer structure, facilitating smaller scale fabrication of sensor 20 and the microfluidic device including sensor 20.

Reference chamber 30 comprises a sealed or closed chamber but for being fluidly coupled to microfluidic passage 38. For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. The term "fluidly coupled" shall mean that two or more fluid transmitting volumes are connected directly to one another or are connected to one another by intermediate volumes or spaces such that fluid may flow from one volume into the other volume.

Reference chamber 30 may contain a gas, such as air, at a predetermined reference pressure calibrated with temperature consideration. In one implementation, reference chamber 30 comprises a chamber surrounded by solid gas impermeable walls that do not flex or bend during use of sensor 20. Although schematically illustrated as being rectangular, reference chamber 30 may have a variety of sizes and shapes.

Sensed volume 34 comprises a volume, the pressure of which is to be sensed by sensor 20. Sensed volume 34 may contain a liquid, such as a sample and/or reagent. Sensed volume 34 may comprise a closed chamber or may comprise a passage along which liquid flows, such as from an inlet to an outlet. Sensed volume 34 may comprise a channel or passage that guides liquid between various sample preparation and testing stages. For example, sensed volume 34 may comprise a channel or passage that guides liquid through or across filters, microfluidic pumps, heaters, and microfluidic sensors that sense characteristics of the liquid or analyte of the liquid. Sensed volume 34 may comprise linear fluid passages, curved fluid passages or serpentine fluid passages. Such passages may have uniform or varying cross-sectional dimensions.

Microfluidic channel 38 comprises a microfluidic passage interconnecting sensed volume 34 to reference chamber 30 while containing liquid volume 42. Microfluidic channel 38 has an interior which is fluidly connected to the interior of reference chamber 30 and the interior of sensed volume 34. Microfluidic channel 38 has a cross-sectional area such that liquid volume 42 completely occludes or completely extends across the cross-sectional area of microfluidic channel 38, blocking reference chamber 30 from sensed volume 34. In one implementation, microfluidic channel 38 has a length such that liquid volume 42, although moving within microfluidic channel 38, is contained within microfluidic channel 38 despite the largest expected changes in the pressure of sensed volume 34. As will be described hereafter, in other implementations, sensor 20 may additionally comprise an expansion chamber that receives liquid volume 42 and prevent liquid volume 42 from flowing into and potentially contaminating sensed volume 34. Although illustrated as linearly extending between sensed volume 34 and reference chamber 30, microfluidic passage 38 may have different shapes. For example, microfluidic passage 38 may alternatively extend in a serpentine fashion between reference chamber 30 and sensed volume 34. It should be understood that the relative dimensions or proportions schematically illustrated in FIG. 1 are only exemplary.

Liquid volume 42 comprises a volume of liquid captured within microfluidic passage 38 and hydrophilically adhered to the internal surfaces of microfluidic passage 38, wherein the volume is sufficiently large so as to seal against such internal surfaces, forming a movable liquid partition between reference chamber 30 and sensed volume 34. Liquid volume 42 moves within microfluidic passage 38 in response to changes in pressure within sensed volume 34. For example, liquid volume 42 may move to the left or may move to the right (as shown in broken lines) within microfluidic passage 38 to maintain equal pressures on opposite sides of liquid volume 42. In one implementation, liquid volume 42 comprises a liquid metal. For example, in one implementation, liquid volume 42 comprises a liquid metal alloy, such as a eutectic alloy, such as Galinstan. In other implementations, liquid volume 42 may comprise other liquids, such as water.

Sensor 44 comprises a sensing device that senses the positioning of liquid volume 42 within and along microfluidic channel 38. Sensor 44 outputs signals indicating the positioning of the volume 42 of liquid along microfluidic channel. As the pressure within sensed volume increases, volume 42 moves towards reference chamber 30 within microfluidic channel 38 such that the pressure on opposite sides of volume 42 is equal. As a pressure within the sensed volume decreases, volume 42 moves towards sensed volume 34 within microfluidic channel 38 such that the pressure on opposite sides of volume 42 is equal. The signals output by sensor 42 indicating the positioning of volume 42 also indicate the pressure within sense volume 34.

In one implementation, the signals output by sensor 42 are used to determine a numerical pressure value for the pressure within volume 34. For example, in one implementation, the signals from sensor 44 are utilized to lookup a pressure value in a lookup table or to determine a pressure value using a predetermined formula, wherein the lookup table or formula is empirically determined based upon particular characteristics of pressure sensor 320.

In another implementation, the signals output by pressure sensor 320 are utilized to determine a relative pressure for determining whether the pressure of the sensed volume satisfies a predetermined threshold. For example, the sensing of liquid volume 42 at a predetermined position along microfluidic channel 38 by sensor 44 may result in signals that are compared to a predefined threshold and wherein an action may be automatically triggered in response to such signals satisfying the predefined threshold, regardless of whether a numerical value for the pressure is determined. In one implementation the sensing of liquid volume 42 at a predetermined position automatically triggers an action by a controller such as the output of an alert or warning, the actuation or termination of operation of a heater, the actuation or termination of operation of a pump and/or the actuation of termination of ace sensor.

In one implementation, sensor 44 comprises an impedance sensor, wherein an electrical field is produced within the interior of microfluidic channel 38 between an electrically coupled electrode and a ground, such as a floating ground or an electrically grounded electrode. The impedance measured at electrically charged electrode varies in response to the positioning of volume 42 within or out of the electric field. Signals output from sensor 44 indicating changes in the impedance may also indicate the positioning of liquid volume 42 which indicates the pressure within sense volume 34.

In one implementation, sensor 44 is integrated as part of a microfluidic chip in which reference chamber 30, sense volume 34 and microfluidic channel 38 are formed. For example, the charge electrode may comprise an electrically conductive trace or layer formed upon or within the substrate of the microfluidic chip. The electrically grounded electrode may further comprise an electrically conductive trace or layer formed upon or within the substrate of the microfluidic chip. Such electrically conductive traces may be deposited using chemical vapor deposition, plasma enhanced chemical vapor deposition, atomic layer deposition, photolithography and other various semiconductor fabrication deposition technologies, facilitating the formation of sensor 44 or at least portions of sensor 44 at such micro-scales. Because the electrically conductive traces or layers are integrally formed as part of the microfluidic chip, the amount of real estate or surface area occupied by sensor 44 may be reduced as compared to sensors 44 that are otherwise mounted to a microfluidic chip. Moreover, in some implementations, sensor 44 may be concurrently fabricated with the fabrication of other microfluidic devices on the microfluidic chip. For example, a single layer being fabricated may include portions of sensor 44 as well as portions of another microfluidic device. In one example, a TaAl compound alloy is used for the thermal inkjet heater as resistive material. The same material can be adapted to be an electrode to be exposed to the liquid. In other examples, WSiN, TiN etc. can be used for similar purpose with different chemical corrosion resistance consideration.

In other implementations, sensor 44 may comprise other sensing devices or other sensing technologies that detect the change in positioning of liquid volume 42 along the length of microfluidic channel 38. For example, in one implementation, sensor 44 may comprise an optical sensor, such as a photo emitter-detector pair. In yet other implementations, sensor 44 may comprise a position sensor that comprises a pair of electrodes that differently conduct electrical current through or across microfluidic channel 38 depending upon the presence or absence of liquid volume 42 between such electrodes. For example, in one implementation, liquid volume 42 may compose an electrically conductive liquid, wherein the presence of volume 42 increases electric conductivity across channel 38 as compared to the absence of volume 42. It still other implementations, sensor 44 may compose other types of position sensors. For example, in other implementations, sensor 44 may comprise an electrical capacitance or an electrical impedance sensor, wherein the geometry may remain the same, but wherein a probing voltage might be different.

Figure 2:
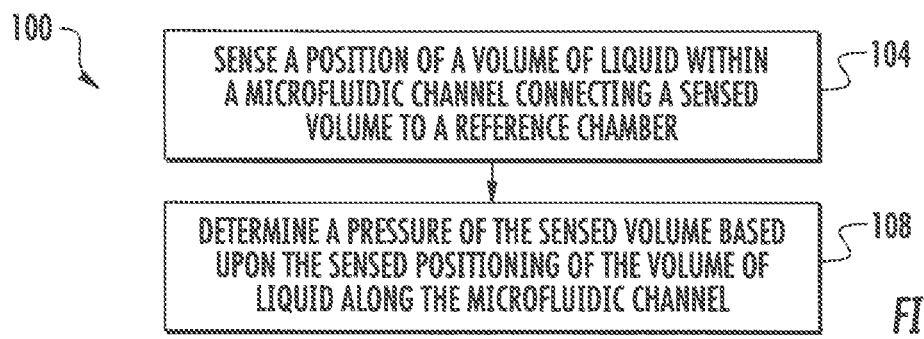
FIG. 2 is a flow diagram of an example method for determining a pressure in a microfluidic device.

FIG. 2 is a flow diagram of an example method 100 for sensing pressure within a sensed volume. Although method 100 is described as being carried out using sensor 20, method 100 may additionally be carried out using any of the sensors described in this disclosure or other sensors that operate in a similar fashion. As indicated by block 104, sensor 44 senses a position of a volume of liquid 42 within microfluidic channel 38 which connects or interconnects sensed volume 44 and reference chamber 30. As described above, in one implementation, sensor 44 comprises an impedance sensor which senses changes in impedance of an electrical field within or across the interior of microfluidic channel 38, wherein the impedance signals vary in response to changes in the positioning of liquid volume 42. In other implementations, the sensing of the position of liquid volume 42 within microfluidic channel 38 may be performed using other sensing technologies or devices.

As indicated by block 108, the pressure of sensed volume 34 is determined based upon the sensed positioning of liquid volume 42 along microfluidic channel 38. In one implementation, the signals output by sensor 44 are directly translated to a corresponding pressure within sensed volume 34. In one implementation, such translation is mechanically carried out. In another implementation, such translation is carried out by a controller such as a processing unit following instructions contained in a non-transitory computer-readable medium, such as software, or such as a processing unit embodied as an integrated circuit, such as an application-specific integrated circuit or a field programmable gate array. The determined pressure may be displayed or otherwise output, stored in memory for subsequent use or output, or may serve as a basis or trigger for initiating or actuating other components of the microfluidic chip as part of a testing or diagnostic protocol. For example, changes in the pressure of sensed volume 34 may trigger actuation of the microfluidic pump, actuation of a valve, actuation of a heater or actuation of a microfluidic sensor to detect a characteristic of a liquid sample or analyte within the liquid sample.

Figure 3:
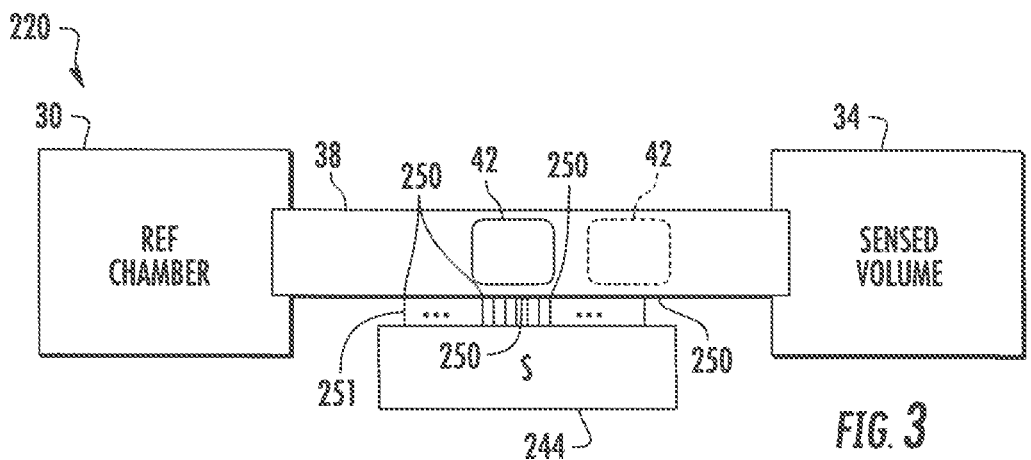
FIG. 3 is a schematic diagram of another example pressure sensor.

FIG. 3 schematically illustrates pressure sensor 220, another example pressure sensor. Pressure sensor 220 is similar to pressure sensor 20 except that pressure sensor 220 comprises sensor 244 in place of sensor 44. Those remaining components of sensor 220 which correspond to components of sensor 20 are numbered similarly.

Sensor 244, like sensor 44, comprises a sensing device that detects the positioning of liquid volume 42 along microfluidic channel 34. Sensor 244 comprises a multitude of position sensing locations 250 spaced along microfluidic channel 34. Each sensing location 250 (schematically represented by the end of a line 251 extending from sensor 244 into connection with microfluidic passage 38) senses the positioning of liquid volume 42 independent of the other sensing locations 250. Each sensing location 250 outputs a signal that may be different from or distinct from the signals output by the other sensing locations 250 spaced along microfluidic channel 34. As a result, rather than simply detecting the position of volume 42 relative to one particular sensing location along channel 38, sensor 244 may more precisely detect the position of liquid volume 42 to more precisely detect the pressure of sense volume 34.

The resolution at which sensor 244 may detect the positioning of the volume 42 depends upon the resolution or pitch of the various sensing locations 250. In one implementation, sensing locations 250 are uniformly and equally spaced from one another along microfluidic channel 38. In another implementation, sensing location 250 are non-uniformly spaced from one another along microfluidic channel 38 to provide non-linear sensitivity along channel 38. For example, sensing locations 250 may have a greater density or be closer to one another and therefore provide greater resolution along particular portions or regions microfluidic channel 38 where liquid volume 42 is expected to be located a majority of the time. Sensing locations 250 may be closer to one another or have a greater density along a first region as compared to along a second region of channel 38 in circumstances where positioning of volume 42 within the first region corresponds to a range of pressures where greater sensitivity (a high-resolution) with respect to changes in the pressure is desired.

In one implementation in which sensor 244 comprises an impedance sensor, each of sensing locations 250 may comprise an electrically coupled electrode which cooperates with a corresponding electrical ground or a shared electrical ground to form different electrical fields within microfluidic channel 38. In such an implementation, differences in the electrical impedance measured at each of the electric charge electrodes may be correlated to a more precise positioning of volume 42 and a more precise estimate or determination of the pressure of sensed volume 34.

In other implementations, the different sensing locations 250 may be provided by other structures depending upon the type of position sensor. For example, in the case of a position sensor that utilizes electrical conductance, each of sensing locations 250 may comprise a separate electrode. In the case of a position sensor that utilizes optical sensing, each sensing location 250 may comprise an individual photo emitter-detector pair. In some implementations, sensor 244 may comprise a series of multiple individual sensors or sensor elements.

Figure 4:
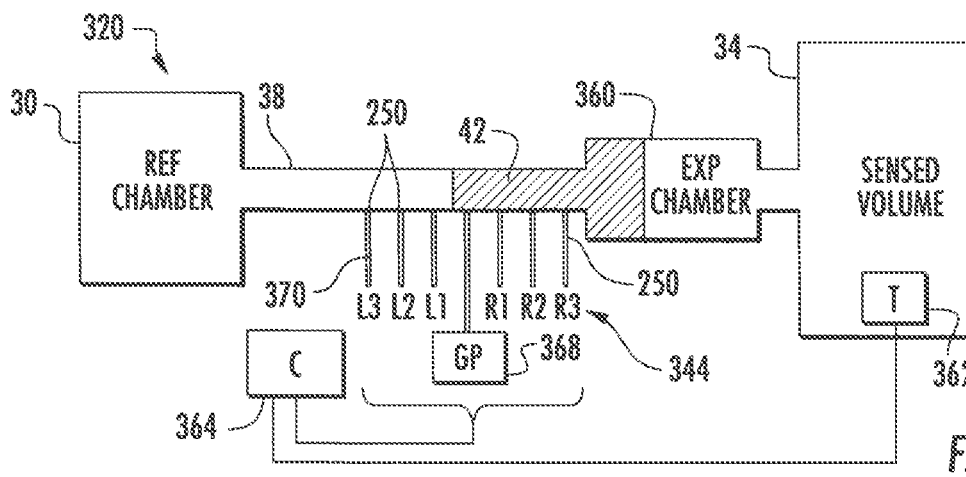
FIG. 4 is a schematic diagram of another example pressure sensor.

FIG. 4 schematically illustrates pressure sensor 320, another example pressure sensor. Pressure sensor 320 is similar to pressure sensor 220 except that pressure sensor 320 is specifically illustrated as additionally comprising expansion chamber 360, temperature sensor 362 and controller 364. Pressure sensor 320 is further specifically illustrated as composing impedance position sensor 344 in place of sensor 244. Those remaining components of sensor 320 which correspond to components of sensors 20 and 220 are numbered similarly.

Expansion chamber 330 comprises a chamber positioned between microfluidic channel 38 and sensed volume 34. Expansion chamber 360 provides a sufficient volume to receive liquid volume 42 and to inhibit the movement of liquid volume 42 into sensed volume 34 even under extreme pressure changes. Although illustrated as being rectangular, in other implementations, expansion chamber 360 may have other shapes and other proportional sizes. In some implementations, expansion chamber 360 may comprise an elongated serpentine passage. In yet other implementations where the risk of liquid volume 42 entering sensed volume 34 is minimal or inconsequential, expansion chamber 360 may be omitted.

Position sensor 344, like sensor 244, comprises a sensing device that detects the positioning of liquid volume 42 along microfluidic channel 34 based upon signals from a multitude of differently sensing locations 250 spaced along microfluidic channel 38. In the example illustrated, position sensor 344 comprises an impedance sensor comprising a shared ground probe 368 and a series of spaced electrically charged electrodes 370 (L1, L2, L3, R1, R2, R3). Electrodes 370 form an electric field with ground probe 368, wherein the impedance at each of such electrodes 370 varies depending upon the presence or absence of liquid volume 42 within the respective field. In one implementation, each electrode has a width of at least 100 nm.

As explained above, in one implementation, sensing locations 250 are uniformly and equally spaced from one another along microfluidic channel 38. In one implementation, electrodes 370 providing sensing locations 250 are uniformly spaced from one another with a center-to-center pitch of less than 1 mm. In one implementation, electrodes 370 are uniformly spaced from another by at least 0.1 um and no greater than 5 mm. In another implementation, sensing locations 250 are non-uniformly spaced from one another along microfluidic channel 38. For example, sensing locations 250 may be closer to one another and therefore provide greater resolution along particular portions or regions microfluidic channel 38 where liquid volume 42 is expected to be located a majority of the time. Sensing locations 250 may be denser or closer to one another along a first region as compared to along a second region of channel 38 in circumstances where positioning of volume 42 within the first region corresponds to a range of pressures where greater sensitivity (a high-resolution) with respect to changes in the pressure is desired.

Temperature sensor 362 comprises a device to sense temperature of at least portions of sensed volume 34. Signals from temperature sensor 362 are transmitted to controller 364. Temperature sensor 362 facilitates more precise measurement of pressure within sense volume 34 by allowing determination of the pressure within sensed volume 34 to take into account temperature variations according to the ideal gas law PV+nRT, wherein P is the pressure, V is a volume, n is a number of moles, R is the gas constant and T is the temperature. In other implementations, the determination of pressure within sensed volume 34 may be determined utilizing a predetermined default temperature value, such as an average, median or mode of expected temperatures for the device employing sensor 320 during testing. In such implementations, temperature sensor 362 may be omitted.

Controller 364 comprises the processing unit that utilizes signals from sensor 344. For purposes of this application, the term "processing unit" shall mean a presently developed or future developed computing hardware that executes sequences of instructions contained in a memory. Execution of the sequences of instructions causes the processing unit to perform steps such as generating control signals. The instructions may be loaded in a random access memory (RAM) for execution by the processing unit from a read only memory (ROM), a mass storage device, or some other persistent storage. In other embodiments, hard wired circuitry may be used in place of or in combination with software instructions to implement the functions described. For example, controller 364 may be embodied as part of one or more application-specific integrated circuits (ASICs). Unless otherwise specifically noted, the controller is not limited to any specific combination of hardware circuitry and software, nor to any particular source for the instructions executed by the processing unit.

In one implementation, controller 364, following instructions contained in a non-transitory memory or circuitry, compares such signals from sensor 344 to predefined criteria or thresholds, wherein actions by controller 364 are automatically triggered in response to the signals from sensor 344 satisfying the predefined criteria or threshold. For example, controller 364 may adjust the operation of a heater, valve and/or heater automatically in response to signals from sensor 344 satisfying a predefined threshold.

In one implementation, controller 364, following instructions contained in a non-transitory memory, determines a numerical value for the pressure of sensed volume 34 based upon the signals received from sensor 344. In one implementation, controller 364 may consult a lookup table which associates different signals from sensor 344 with different numerical pressure values for volume 34. In another implementation, controller 364 utilizes such signals (in analog or digital form) as part of a formula or equation to calculate a numerical pressure value for volume 34. Such formulas or lookup tables may be empirically created during a calibration phase which may vary depending upon the particular nature or characteristics of sensor 320. In such implementations, the determined numerical pressure value for volume for may be stored and/or displayed. In some implementations, the determined numerical pressure value is then compared to a predefined threshold or multiple predefined thresholds for potentially triggering additional control signal output by controller 364.

Figure 5:
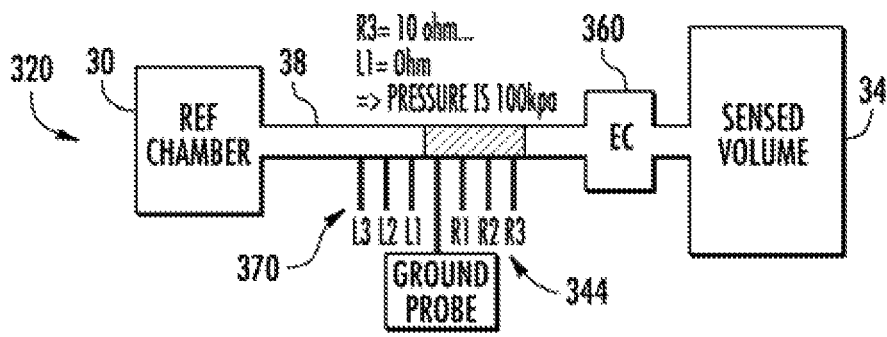
FIGS. 5 and 6 are schematic diagrams of a portion of the example pressure sensor of FIG. 4 in different pressure sensing states.
Figure 6:
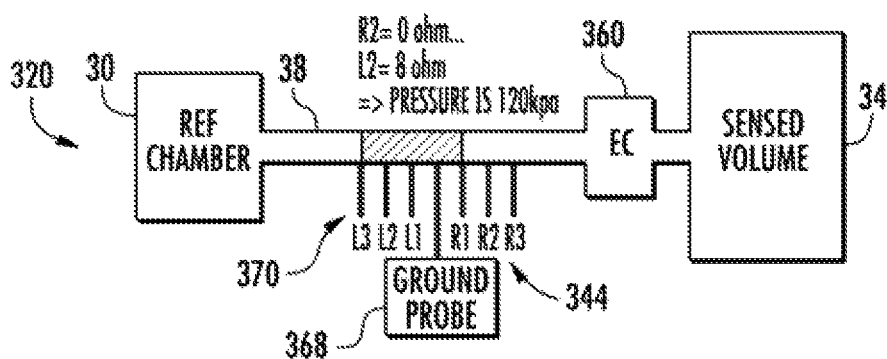

FIGS. 5 and 6 schematically illustrate two example states of pressure sensor 320, presuming no temperature change. In the example state illustrated in FIG. 5, the pressure within sensed volume 34 causes the liquid volume 42 to be displaced to the position shown in which liquid volume 42 is withdrawn from electrode L1 but overlaps electrode R3. As a result, the sensed impedance at sensing electrode R3 is 10 ohms while the sensed impedance at sensing electrode L1 is 0 ohms. Controller 364 (shown in FIG. 4) utilizes the differences between the sensed impedance at the two electrodes as a basis for determining a numerical pressure value for the pressure of sensed volume 34. As discussed above, in one implementation, controller 64 may consult a lookup table, whereas in another implementation, controller 64 may apply a predetermined formula, each of the formula and the lookup table being based upon empirically determined relationships between such signals and the actual pressure of sense volume 34 which may vary amongst different sensors and different devices depending upon the particular characteristics of sensor 320 and the device in which sensor 320 is employed. In the example state illustrated, controller 364 may determine that the pressure of sense volume 44 is 100 kpa.

In the example state illustrated in FIG. 6, the pressure within sensed volume 34 has increased, resulting in liquid volume 42 being displaced towards reference chamber 30. In the example illustrated, liquid volume 42 is withdrawn from electrode R2 as well as electrode R3 such that an impedance of 0 ohms is output by both electrodes R2 and R3. At the same time, liquid volume 42 overlaps electrode L2, resulting electrode L2 having impedance of 8 ohms. Controller 364 (shown in FIG. 4) utilizes the differences between the sensed impedance at the two electrodes as a basis for determining a numerical pressure value for the pressure of sensed volume 34. In some implementations, controller 364 may determine a numerical value for the pressure of sensed volume 34 utilizes signals from more than two of the electrodes of sensor 344. In the hypothetical example illustrated, controller 364 may determine the pressure of sensed volume 34, based upon the signals from electrodes R2 and L2 is 120 kpa. As discussed above, the determined numerical pressure value for sensed volume 34 may be output by being displayed, may be stored or may be used as a value for triggering the control of other components of device in which pressure sensor 320 is utilized.

Figure 7:
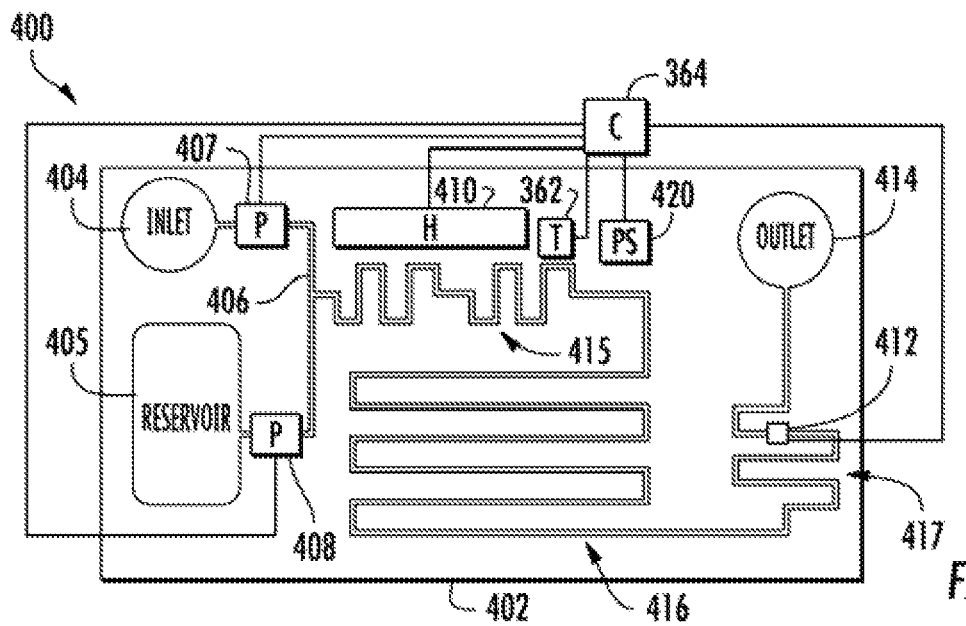
FIG. 7 is a schematic diagram of an example microfluidic device incorporating the example pressure sensor.

FIG. 7 is a schematic diagram of an example microfluidic device 400 employing an example pressure sensor 420. Microfluidic device 400 comprises a microfluidic chip having microfluidic channels or passages through which a sample of liquid is to be guided. In the example illustrated, microfluidic device 400 comprises a microfluidic chip that facilitates point-of-care diagnostics. In the particular example illustrated, microfluidic device 400 comprises a device that facilitates a polymerase chain reaction of a sample with sensing of the sample. In other implementations, microfluidic device 400 may have a different microfluidic architecture and other microfluidic components (pumps, heaters, filters, valves, sensors) for other liquid testing or preparation objectives.

Microfluidic device 400 comprises substrate 402, inlet 404, reservoir 405, microfluidic passage 406, pumps 407, 408, heater 410, sample sensor 412 and outlet 414. Substrate 402 comprises a base or foundation for the microfluidic chip in which inlet 404, reservoir 405, microfluidic passage 406 and outlet 414 are formed. In one implementation, such structures in substrate 402 are formed through material removal processes. In another implementation, such structures of substrate 402 are formed through molding, etching, or various material removal or additive processes. In one implementation, substrate 402 comprises silicon. In another implementation, substrate 402 composes a ceramic or a polymeric material.

Inlet 404 comprises a chamber or port in substrate 402 to receive a liquid sample. Reservoir 405 comprises a liquid chamber or port to receive and supply a secondary liquid, such as a reagent for interacting with the sample liquid or a wash liquid containing a washing fluid for preparing sample sensor 414, such as a surface enhanced Ramen spectroscopy sensor, for sensing. Microfluidic passage 406 comprises a microfluidic passage directing fluids from inlet 404 and 405 to various stages, to sample sensor 412 and ultimately to outlet 414. In the example illustrated, microfluidic passage 406 guides sample received through inlet 404 and the reagent of reservoir 405 to facilitate mixing. Microfluidic passage 406 further directs of the mixed fluid through the polymer chain reaction region 415, a separation region 416 and a sample sensing region 417 prior to reaching outlet 414.

Pumps 407, 408 comprise devices to selectively move liquids from inlet 404 and reservoir 405, respectively, through and along microfluidic passage 406. In one implementation, pumps 407, 408 comprise bubble jet inertial pumps. In other implementations, pump 407, 408 may comprise piezoresistive pumps or other forms of pumps.

Heater 410 comprises a device to heat the liquid along microfluidic passage 406. In one implementation, heater 410 comprises embedded electrical resistor which emits heat in response to the application of electrical current. In other implementations, heater 410 may comprise other types of heaters or may be omitted. In the example illustrated in which device 400 is to facilitate polymerase chain reactions, heater 410 heats the liquid sample within polymerase chain reaction 415 through multiple heating and cooling cycles.

Sample sensor 412 comprises a device within sample sensing region 417 of microfluidic passage 406. Sample sensor 412 senses one or more characteristics of the sample or analytes separated out from the received sample. In one implementation, sample sensor 412 comprises a surface enhanced illumination (SEL) type sensor. In one implementation, sample sensor 412 comprises a surface enhanced Ramen spectroscopy (SERS) sensor. In yet other implementations, sample sensor 412 comprise other sensors employing other sensing technologies.

Pressure sensor 420 may comprise any of the above described pressure sensors 20, 220, 320. In the example illustrated, pressure sensor 420 is similar to pressure sensor 320 in which pressure sensor 420 comprises temperature sensor 362 and controller 364. In the example illustrated, the sensed volume comprises the volume or interior of microfluidic passage 406. In the example illustrated, the sensed volume 34 branches off of a portion of microfluidic passage 406 between polymerase chain reaction region 415 and separator region 416. In other implementations, pressure sensor 420 may be provided at other locations on substrate 402.

In the example illustrated, in operation, controller 364 outputs control signals causing pumps 407 and 408 to pump the sample and reagent from inlet 404 and reservoir 405, wherein such liquids are mixed and move to polymerase chain reaction region 415. While the solution is within region 415, controller 364 controls heater 410 to cycle the solution through multiple cycles, such as an initialization step, denaturation step, annealing step and an extension/elongation step. Following the completion of such cycles, controller 364 further directs pumps 407, 408 to move the solution through separation region 416, wherein separation is facilitated through the use of any of various separation technologies such as filters, electrophoresis or the like. Thereafter, the solution is pumped to sensing region 417, where sample sensor 412 detects one or more characteristics of the analyte prior to the sensed analyte being discharged at outlet 414.

During such operation, controller 364 further receives signals from pressure sensor 420. In the example illustrated, controller 364 receives signals from electrodes 370 (described above), wherein such signals have varying impedances based upon the position of liquid volume 42 within microfluidic channel 38. The sensed position of liquid volume 42 within microfluidic passage 38 and the temperature signals from temperature sensor 362 are utilized by controller 364 to determine a pressure within microfluidic passage 406. Based upon such signals indicating the pressure within microfluidic passage 406, controller 364 may adjust or alter the operation of pumps 407, 408, heater 410 and/or sample sensor 412. In some implementations to a 364 may further output signals causing the detected pressure to be displayed.

Although the present disclosure has been described with reference to example implementations, workers skilled in the art will recognize that changes may be made in form and detail without departing from the spirit and scope of the claimed subject matter. For example, although different example implementations may have been described as including one or more features providing one or more benefits, it is contemplated that the described features may be interchanged with one another or alternatively be combined with one another in the described example implementations or in other alternative implementations. Because the technology of the present disclosure is relatively complex, not all changes in the technology are foreseeable. The present disclosure described with reference to the example implementations and set forth in the following claims is manifestly intended to be as broad as possible. For example, unless specifically otherwise noted, the claims reciting a single particular element also encompass a plurality of such particular elements. The terms "first", "second", "third" and so on in the claims merely distinguish different elements and, unless otherwise stated, are not to be specifically associated with a particular order or particular numbering of elements in the disclosure.

What is claimed is:

1. A microfluidic pressure sensor comprising:
 a reference chamber;
 a sensed volume containing a sample liquid;
 a microfluidic channel connecting an interior of the reference chamber to an interior of the sensed volume;
 a volume of liquid contained and movable within the microfluidic channel while occluding the microfluidic channel, wherein the liquid is different from the sample liquid;
 an expansion chamber fluidly coupled between the sensed volume and the microfluidic channel, the expansion chamber having a cross-sectional area measured along a first plane that is different than a cross-sectional area of the microfluidic channel measured on a second plane, wherein the first plane and the second plane are parallel and a volume sized to receive the volume of liquid and to inhibit movement of the volume of liquid from the microfluidic channel into the sensed volume; and a sensor to output signals indicating positioning of the volume of liquid along the microfluidic channel, wherein positioning of the volume of liquid along the microfluidic channel indicates a pressure of the sensed volume.

2. The microfluidic pressure sensor of claim 1 further comprising a temperature sensor.

3. The microfluidic pressure sensor of claim 1, wherein the sensor comprises an optical sensor along the microfluidic channel.

4. The microfluidic pressure sensor of claim 3, wherein the sensor comprises a second optical sensor along the microfluidic channel and spaced from the optical sensor.

5. The microfluidic pressure sensor of claim 1, wherein the liquid comprises electrically conductive liquid, and wherein sensor comprises an impedance sensor comprising:
a local ground along the microfluidic channel; and
an electrode along the microfluidic channel and spaced from the local ground, wherein the electrode is to receive electrical current forming an electric field between the electrode and the local ground and wherein electrical impedance of the electrode varies based upon presence of the volume of liquid within the microfluidic channel and within the electric field.

6. The microfluidic pressure sensor of claim 5 further comprising a second electrode along the microfluidic channel, the second electrode being spaced from the electrode and local ground, wherein the second electrode is to receive electrical current forming a second electric field between the second electrode and the local ground and wherein electrical impedance of the second electrode varies based upon presence of the volume of liquid within the microfluidic channel and within the second electric field.

7. The microfluidic pressure sensor of claim 6, wherein the electrode and the second electrode are on opposite sides of the local ground.

8. The microfluidic pressure sensor of claim 5 comprising:
a first series of spaced electrodes, including the electrode, on a first side of the local ground; and
a second series of spaced electrodes on a second side of the local ground, wherein each of the electrodes is to receive electrical current forming a respective electric field between the respective electrode and the local ground and wherein electrical impedance of the respective electrode varies based upon presence of the volume of liquid within the microfluidic channel and within the respective electric field.

9. The microfluidic pressure sensor of claim 1, wherein the liquid comprises electrically conductive liquid and wherein sensor comprises an impedance sensor comprising:
a local ground along the microfluidic channel; and
an electrode along the microfluidic channel and spaced from the local ground, wherein the electrode is to receive electrical current forming an electric field between the electrode and the local ground and wherein electrical impedance of the electrode varies based upon presence of the volume of liquid within the microfluidic channel and within the electric field.

10. A method for sensing microfluidic pressure within a sensed microfluidic volume, the method comprising:

sensing a position of a volume of liquid within a microfluidic channel connecting the sensed volume to a reference chamber; and determining a pressure of the sensed volume containing a sample liquid based upon the sensed positioning of the volume of liquid along the microfluidic channel, wherein the liquid within the microfluidic channel is different from the sample liquid, wherein the microfluidic channel includes an expansion chamber fluidly coupled between the sensed volume and the microfluidic channel, the expansion chamber having a cross-sectional area measured along a first plane that is different than a cross-sectional area of the microfluidic channel measured on a second plane, wherein the first plane and the second plane are parallel and a volume sized to receive the volume of liquid and to inhibit movement of the volume of liquid from the microfluidic channel into the sensed volume.

11. The method of claim 10, wherein sensing the position of the volume of liquid within the microfluidic channel comprises forming an electric field within the microfluidic channel between an electrode and a local ground, wherein impedance at the electrode varies based upon presence of the volume of liquid within the microfluidic channel and within the electric field.

12. The method of claim 11, wherein sensing the position of the volume of liquid within the microfluidic channel comprises forming a second electric field within the microfluidic channel between a second electrode and the local ground, wherein impedance at the second electrode varies based upon presence of the volume of liquid within the microfluidic channel and within the second electric field.

13. A microfluidic chip comprising:
a first microfluidic channel;
a first sensor to sense a characteristic of a sample fluid within the first microfluidic channel; and
a microfluidic pressure sensor comprising:
a reference chamber;
a second microfluidic channel connecting an interior of the reference chamber to an interior of the first microfluidic channel;
a volume of liquid contained and movable within the second microfluidic channel while occluding the second microfluidic channel, wherein the volume of liquid is different from the sample fluid;
an expansion chamber fluidly coupled between the sensed volume and the microfluidic channel, the expansion chamber having a cross-sectional area measured along a first plane that is different than a cross-sectional area of the microfluidic channel measured on a second plane, wherein the first plane and the second plane are parallel and a volume sized to receive the volume of liquid and to inhibit movement of the volume of liquid from the second microfluidic channel into the first microfluidic channel; and
a second sensor to output signals indicating positioning of the volume of liquid along the microfluidic channel, wherein positioning of the volume of liquid along the second microfluidic channel indicates a pressure of the first microfluidic channel.

14. The microfluidic chip of claim 13, wherein the first sensor comprises a surface enhanced luminescence (SEL) sensor and wherein the second sensor comprises an impedance sensor.

* * * * *